United States Patent
Miki

(10) Patent No.: US 6,710,615 B2
(45) Date of Patent: Mar. 23, 2004

(54) SEMICONDUCTOR ELEMENT TEST APPARATUS, AND METHOD OF TESTING SEMICONDUCTOR ELEMENT USING THE APPARATUS

(75) Inventor: Kazunobu Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/973,049

(22) Filed: Oct. 10, 2001

(65) Prior Publication Data

US 2002/0149385 A1 Oct. 17, 2002

(30) Foreign Application Priority Data

Apr. 12, 2001 (JP) ........................ 2001-113903

(51) Int. Cl.⁷ .............................................. G01R 31/02
(52) U.S. Cl. ...................................... 324/761; 324/754
(58) Field of Search ................................ 324/761, 754, 324/755, 757, 758, 765

(56) References Cited

U.S. PATENT DOCUMENTS

| | | | | |
|---|---|---|---|---|
| 4,899,099 A | * | 2/1990 | Mendenhall et al. | 324/754 |
| 5,089,772 A | * | 2/1992 | Hatada et al. | 324/765 |
| 5,640,101 A | * | 6/1997 | Kuji et al. | 324/754 |
| 5,656,943 A | * | 8/1997 | Montoya et al. | 324/754 |
| 5,825,192 A | * | 10/1998 | Hagihara | 324/757 |
| 5,914,613 A | * | 6/1999 | Gleason et al. | 324/754 |
| 5,949,244 A | * | 9/1999 | Miley | 324/758 |
| 6,072,325 A | * | 6/2000 | Sano | 324/758 |
| 6,075,373 A | * | 6/2000 | Iino | 324/754 |
| 6,307,387 B1 | * | 10/2001 | Gleason et al. | 324/754 |

FOREIGN PATENT DOCUMENTS

| JP | 4-11967 | | 4/1992 | |
|---|---|---|---|---|
| JP | 11064440 A | * | 3/1999 | G01R/31/26 |

* cited by examiner

Primary Examiner—Evan Pert
Assistant Examiner—Jermele Hollington
(74) Attorney, Agent, or Firm—McDermott, Will & Emery

(57) ABSTRACT

In a semiconductor element test apparatus and a method of testing a semiconductor element using the apparatus, a plurality of probe needles are brought into contact with semiconductor elements fabricated on a semiconductor wafer, and a structure is provided for attaching a probe card and a reinforcement member to a probe card hold member. In a plurality of mount positions in which a probe card substrate and a reinforcement member are attached to a probe card hold member, counterbores are formed so as to assume substantially the same depth and shape. Analogous mount structures are realized at a plurality of mount positions by way of the counterbores.

9 Claims, 9 Drawing Sheets

SEMICONDUCTOR ELEMENT TEST APPARATUS, AND METHOD OF TESTING SEMICONDUCTOR ELEMENT USING THE APPARATUS

BACKGROUND OF INVENTION

1. Field of the Invention

The present invention relates to a semiconductor element test apparatus which brings a plurality of probe needles into contact with semiconductor elements fabricated on a semiconductor wafer, as well as to a method of testing a semiconductor element.

2. Background Art

Processes for manufacturing a semiconductor integrated circuit, such as an IC or an LSI, include a test process generally called a wafer test process. As shown in FIG. 8, during the course of a wafer test process, there is employed a semiconductor element test device which brings a plurality of probe needles 7 of a probe card 1 attached to a wafer prober 2 into contact with semiconductor elements fabricated on a semiconductor wafer 5 placed on top of a stage 4. As shown in FIG. 8, the wafer prober 2 is provided with a test head 10, and the test head 10 is connected, by way of a cable 15, to a tester 3 constituted of a computer.

As shown in FIG. 9, the test apparatus performs a test as to whether or not semiconductor elements 6 are non-defective, through the following steps. Namely, the probe needles 7 are brought into contact with respective electrode pads 8 of a plurality of semiconductor elements 6 (i.e., semiconductor chips) fabricated on the semiconductor wafer 5. In this state, an electrical test input signal is sent to the semiconductor elements 6 from the tester 3 by way of the cable 15 and the probe needles 7. A test output signal processed by the semiconductor elements 6 is sent back to the tester 3 by way of the probe needles 7 and the cable 15. FIG. 10 shows a state of contact between the probe needles 7 and the electrode pads 8. The stage 4 is pushed up toward the probe needles 7 during a test, and the electrode pads 8 are brought into contact with the probe needles 7. After completion of the test, the stage 4 is lowered, thereby separating the electrode pads 8 from the probe needles 7.

FIG. 11 is a side view showing the constitution of the prober 2 while the stage 4 remains in a lowered position. FIG. 12 is a perspective view showing a probe card 1 having the probe needles 7 mounted thereon. FIG. 13 is a top view showing the probe card 1. The prober 2 is equipped with the probe card 1. The probe card 1 has a probe card substrate 12 which supports the plurality of probe needles 7. The prober 2 has a test head 10 which operates in cooperation with the probe card 12. A plurality of probe needles 7 are supported on the lower surface of the probe card substrate 12, and on the top of the probe card substrate 12 are provided a reinforcement member 13 for reinforcing the probe card substrate 12, and a plurality of ZIF connectors 11. A plurality of ZIF sockets 9 corresponding to ZIF connectors 11 are provided on the lower surface of the test head 10. The semiconductor elements 6 exchange a test input signal and test output signals with the tester 3, by means of the ZIF connectors 11 being coupled to the ZIF sockets 9. The ZIF sockets 9 incorporate springs and are connected to the ZIF connectors 11 by means of meshing action.

As shown in FIG. 14, the probe card substrate 12 is attached to a probe card hold member 26 along with the reinforcement member 13. As shown in FIG. 15, screws 17 are used for attaching the probe card substrate 12 and the reinforcement member 13. As shown in FIG. 15, the wafer prober 2 is provided with the probe card hold member 26, and the probe card hold member 26 is attached to a movable arm 27. The probe card hold member 26 is used in transporting the probe card 1 into the wafer prober 2 or in transporting the probe card 1 outside the wafer prober 2. The probe card hold member 26 is used for fixing the probe card 1 within the prober 2. The probe card hold member 26 is formed into a ring, and the probe card substrate 12 of the probe card 1 is attached to the probe card hold member 26 with the reinforcement member 13 such that the probe needles 7 protrude from an opening of the ring-shaped probe card hold member 26. As shown in FIG. 16, the probe card 1 is held so as to protrude from an opening 25 formed in an top of the prober 2 while being attached to the probe card hold member 26. The probe card 1 is positioned by means of positioning pins 14 of the test head 10. In this state, the probe card 1 opposes the semiconductor wafer 5 provided on top of the stage 4 with a predetermined space therebetween.

In the related-art apparatus using the screws 17, when a test is performed, the stage 4 is elevated, thereby pressing the semiconductor wafer 5 against the probe needles 7. At this time, stress concentrates at the portions of the probe card substrate 12 where the reinforcement member 13 is attached by means of the screws 17, as a result of which load is imposed so as to induce warpage in the probe card 1. Accordingly, warpage partially develops in the probe card substrate 12. When the probe card 1 has been used over a long period of time, the tip ends of the probe needles 7 become offset from their initial locations. Uniform contact between the probe needles 7 and the semiconductor elements 6 is not sustained. As a result, contact failures arise in some of the semiconductor elements 6, such that non-defective elements 6 may be determined to be defective.

In order to prevent occurrence of warpage in the probe card substrate 12, which would otherwise arise while the probe card substrate 12 is in use, the reinforcement member 13 constituted of a flat plate of hard material is used, as shown in FIG. 17. A structure for attaching the reinforcement member 13 to the probe card substrate 12 and to the probe card hold member 26 is specifically shown in FIG. 18. Counterbores 13a to be used for attaching the screws 17 are formed in two attachment arms 13A and 13C from among four attachment arms 13A through 13D of the reinforcement member 13. In contrast, no counterbores 13a are formed in the remaining two attachment arms 13B and 13D. Thus, the attachment structure is not uniform. such a non-uniform attachment structure is ascribable to the positioning pins 14 of the test head 10. In order to avoid the positioning pins 14, the counterbores 13a are formed in only the attachment arms 13A and 13C. However, the attachment structure is not uniform and fails to sufficiently prevent occurrence of warpage in the probe card substrate 12. Reference numeral 16 designates a through hole through which the attachment screws 17 penetrate.

The test head 10 is a housing in which a plurality of terminals are provided in a concentrated manner for connecting the tester 3 with the probe card 1. As shown in FIGS. 15 and 16, the test head 10 is provided on top of the wafer prober 2 in a reclosable manner. The positioning pins 14 of the test head 10 are provided for enabling the test head 10, the probe card 1, and the wafer prober 2 to be connected together at the same positions at all times. Positioning holes 21 (see FIG. 16) formed in the probe card substrate 12 are located close to the edges of the attachment arms 13A and 13C. Hence, the counterbores 13a are formed in only the attachment arms 13A and 13C.

As shown in FIG. 18, because of such a non-uniform attachment structure, short screws 17 are used for the attachment arms 13A and 13C, and long screws 17 are used for the attachment arms 13B and 13D. The difference in length between the screws 17 also accounts for occurrence of warpage in the probe card substrate 12. Use of two types of screws 17 having different lengths makes attachment and removal of the screws 17 complicated, thus resulting in consumption of excessive time.

When the probe needles 7 are brought into contact with the electrode pads 8 of the semiconductor element 6 under normal conditions, the stage 4 is elevated so as to scrub the surface of the electrode pads 8 after the probe needles 7 have been brought into contact with the electrode pads 8, so as to eliminate an oxide film which naturally arises in the surface of the electrode pads 8. During repetition of a wafer test, insulating material adheres to the tip ends of the probe needles 7, resulting in an increase in contact resistance. As a result, non-defective semiconductor elements 6 are determined to be defective, thereby undesirably deteriorating manufacturing yield of semiconductor elements. In order to prevent such deterioration, abrasion and cleaning of the tip ends of the probe needles 7 is periodically performed. In order to inspect the positional accuracy of the probe needles and the abrasion and cleaning state of the probe needles 7, the probe card substrate 12 is removed from the probe card hold member 26 in conjunction with the reinforcement member 13, by means of removing the screws 17. After inspection, the probe card substrate 12 must be attached again to the probe card hold member 26.

Use of the two types of screws renders attachment and removal of the screws complicated, thereby lengthening working time. As shown in FIGS. 19A and 19B, flat-head screws having flat heads 17A are used as the screws 17. The flat-head screws have shallow slots 17a to be used for rotating screws, and the slots 17a are easily collapsed. Attachment and removal of the screws 17 is performed often, and therefore the screws 17 must be replaced with new ones. Rust-resistant, hard stainless screws have hitherto been used for the screws 17. However, such screws cannot be magnetically attracted to a driver, which deteriorates workability.

SUMMARY OF THE INVENTION

The present invention proposes a semiconductor element test apparatus which improves a structure for attaching a probe card reinforcement member to a probe card hold member and can reduce warpage in the probe card substrate.

Further, the present invention proposes a semiconductor element test apparatus which improves a structure for attaching a probe card reinforcement member to a probe card hold member and can reduce warpage in a probe card substrate by means of realizing commonality of screws used for attaching the probe card reinforcement member.

Further, the present invention proposes a semiconductor element test apparatus which improves a structure for attaching a probe card reinforcement member to a probe card hold member, reduces warpage in a probe card substrate, and enables frequent replacement of screws by means of improving mount screws.

Further, the present invention proposes a semiconductor element test apparatus which improves a structure for attaching a probe card reinforcement member to a probe card hold member, reduces warpage in a probe card substrate, and facilitates attachment and removal of screws by means of improving mount screws.

Further, the present invention proposes a semiconductor element test apparatus which improves a structure for attaching a probe card reinforcement member to a probe card hold member and reduces warpage in a probe card substrate by means of improving the reinforcement member so as to increase the reinforcement strength thereof.

Further, the present invention proposes a semiconductor element test apparatus which improves a structure for attaching a probe card reinforcement member to a probe card hold member and reduces warpage in a probe card substrate, by means of increasing the fastening strength acting between the reinforcement member and the probe card substrate.

Further, the present invention proposes a semiconductor element test method which prevents undesirable deterioration in manufacturing yield of semiconductor elements, through use of a semiconductor element test apparatus which improves a structure for attaching a probe card reinforcement member to a probe card hold member and can reduce warpage in a probe card substrate.

According to one aspect of the present invention, a semiconductor element test apparatus comprises a stage on which a semiconductor wafer having semiconductor elements mounted thereon, and a probe card having a plurality of probe needles opposing the semiconductor wafer, and the semiconductor elements are tested by means of bringing the plurality of probe needles into contact with the semiconductor elements of the semiconductor wafer. The probe card has a probe card substrate for supporting the plurality of probe needles and a reinforcement member to be used with the probe card substrate. The semiconductor element test apparatus has a probe card hold member. The probe card substrate is attached to the probe card hold member in a plurality of mount positions, by means of screws and by way of the reinforcement member. Counterbores of substantially the same depth and shape are formed in respective mount positions on the reinforcement member. The probe card substrate is attached to the probe card hold member by means of the screws and by way of the counterbores.

According to another aspect of the present invention, in a method of testing a semiconductor element uses a test apparatus which brings a plurality of probe needles provided on a probe card into contact with semiconductor elements of a semiconductor wafer. The probe card has a probe card substrate for supporting the plurality of probe needles, and a reinforcement member to be used with the probe card substrate. The semiconductor element test apparatus has a probe card hold member having the probe card attached thereto. The reinforcement member is attached to the probe card substrate and to the probe card hold member at a plurality of mount positions, by means of screws. Counterbores of substantially the same depth and shape are formed in the respective mount positions on the reinforcement member. The probe card substrate is attached to the probe card hold member by means of the screws and by way of the counterbores.

Other and further objects, features and advantages of the invention will appear more fully from the following description.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

First Embodiment

Figure 8:
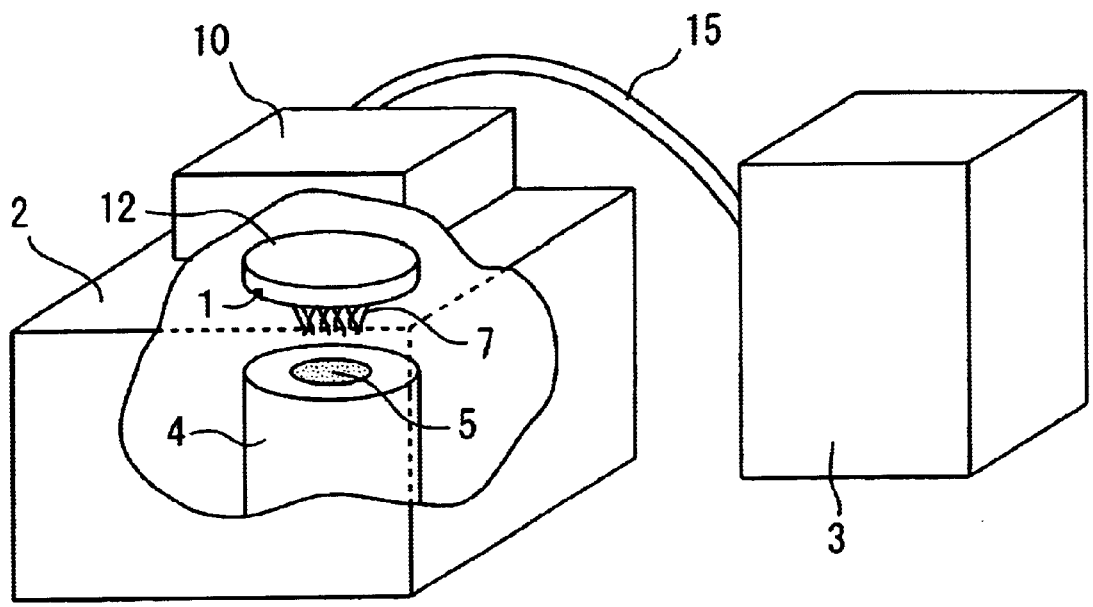
FIG. 8 is a perspective view showing the constitution of a conventional semiconductor element test apparatus.
Figure 9:
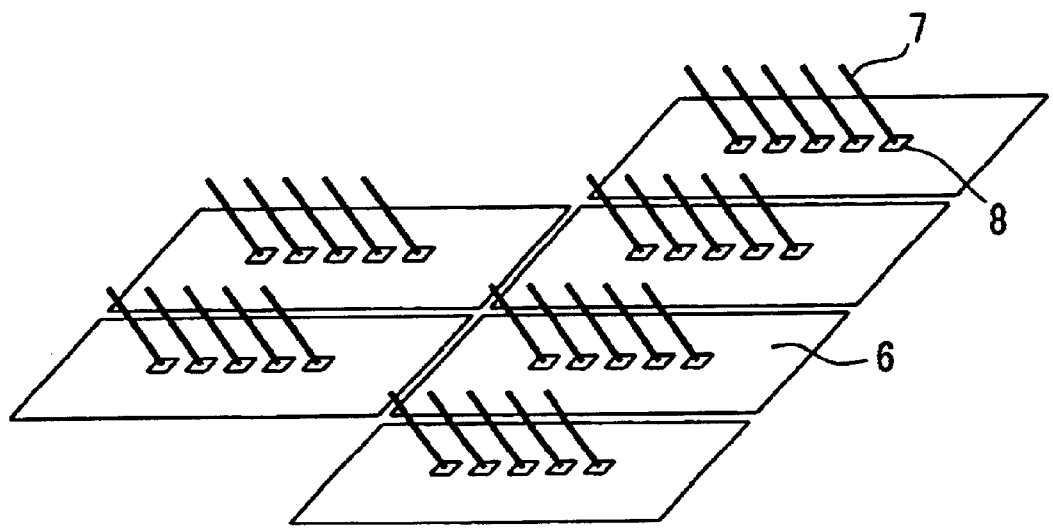
FIG. 9 is a perspective view showing a state of contact between a probe needles and a semiconductor element.
Figure 10:
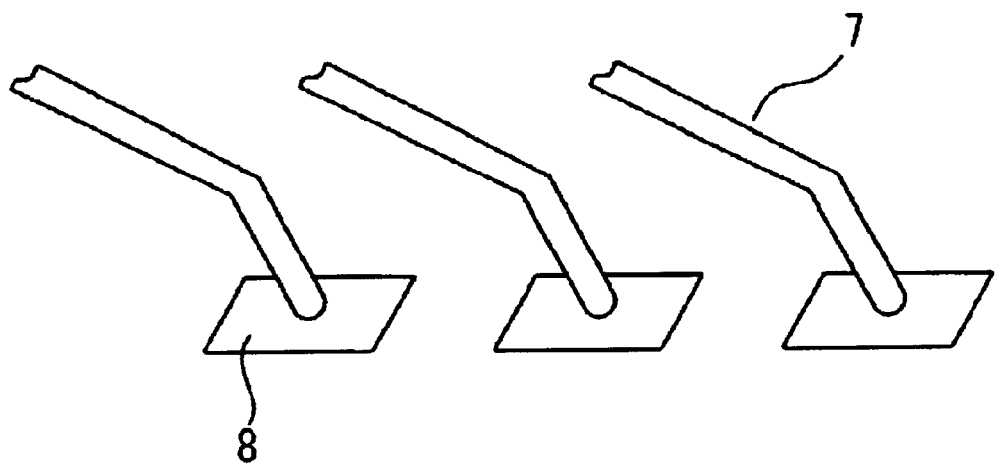
FIG. 10 is a perspective view showing a state of contact between the probe needles and an electrode pad.
Figure 11:
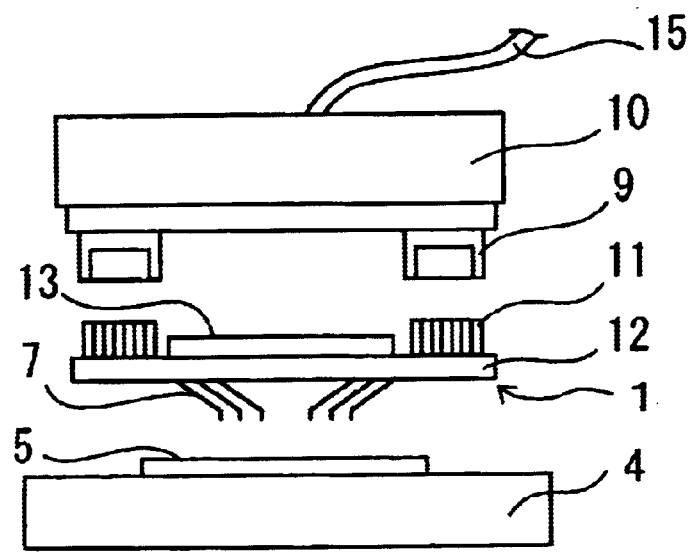
FIG. 11 is a side view showing a constitution of the prober.
Figure 12:
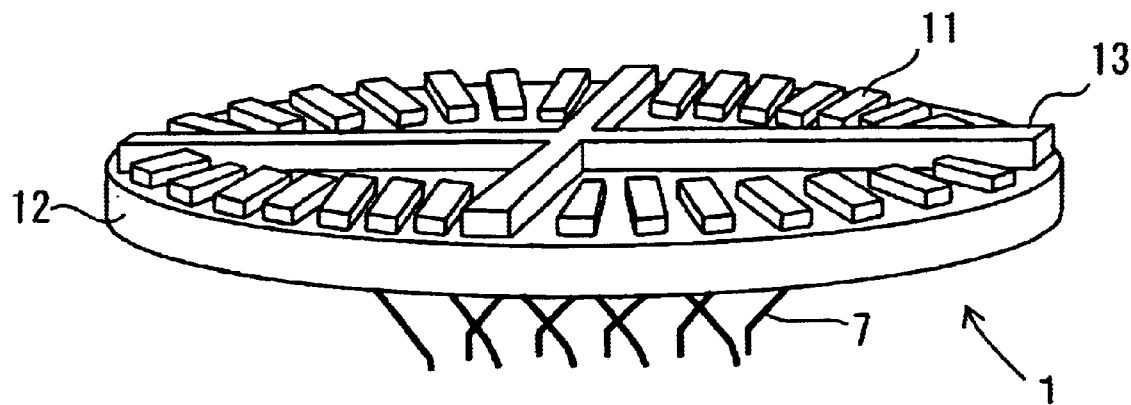
FIG. 12 is a perspective view showing a probe guard having the probe needles mounted thereon.
Figure 13:
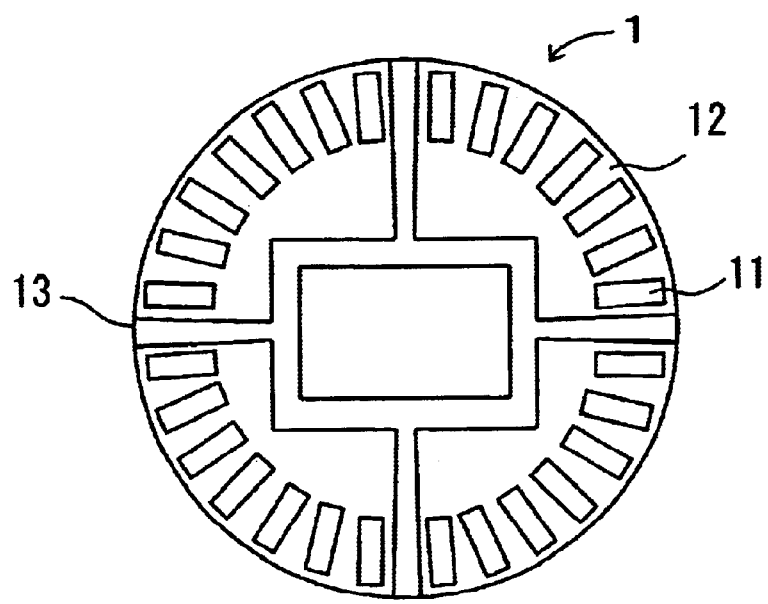
FIG. 13 is a top view showing the probe guard.
Figure 14:
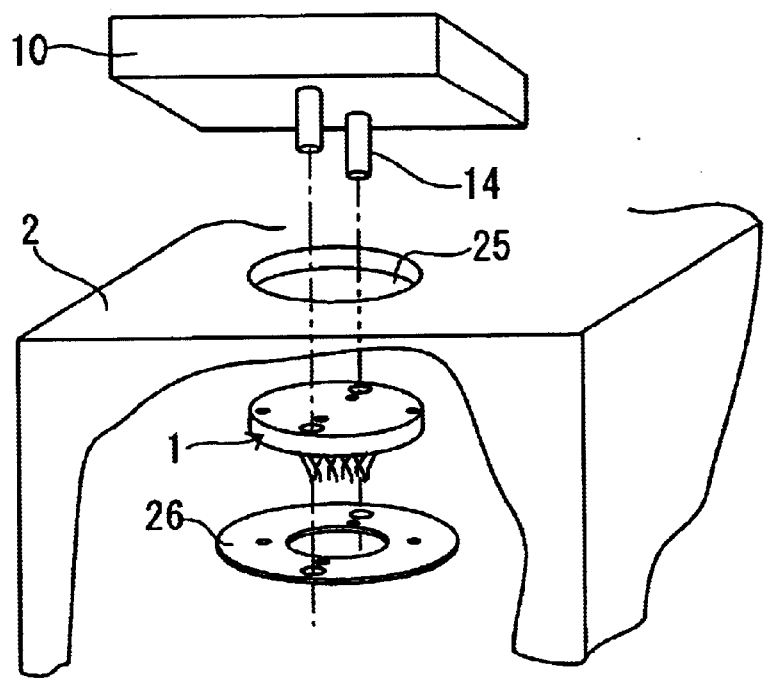
FIG. 14 is a perspective view showing a part of the constitution of the prober.
Figure 15:
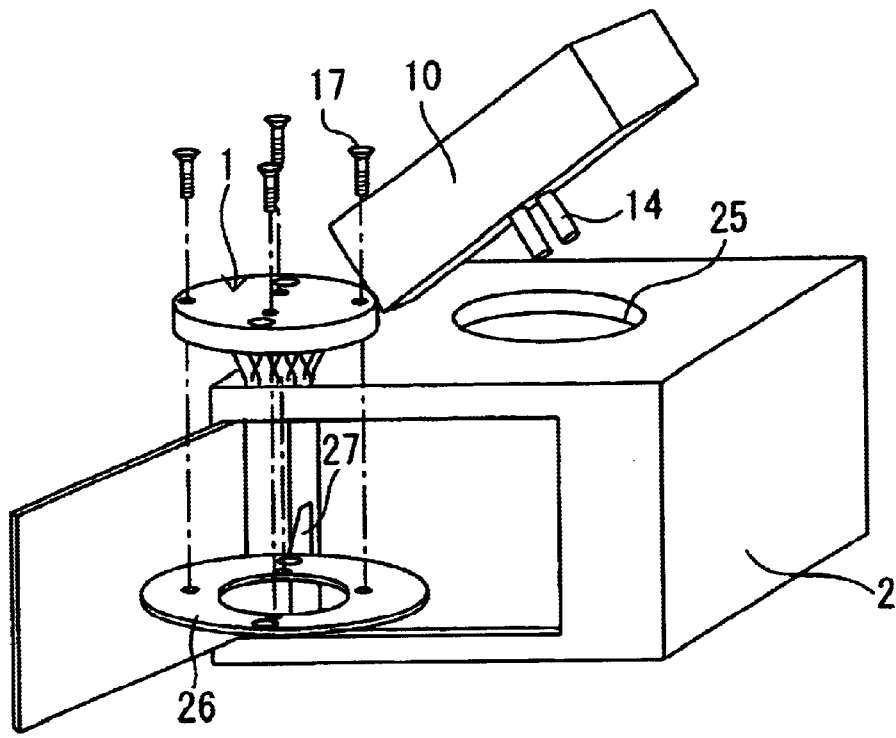
FIG. 15 is a perspective view showing the constitution of the prober.
Figure 16:
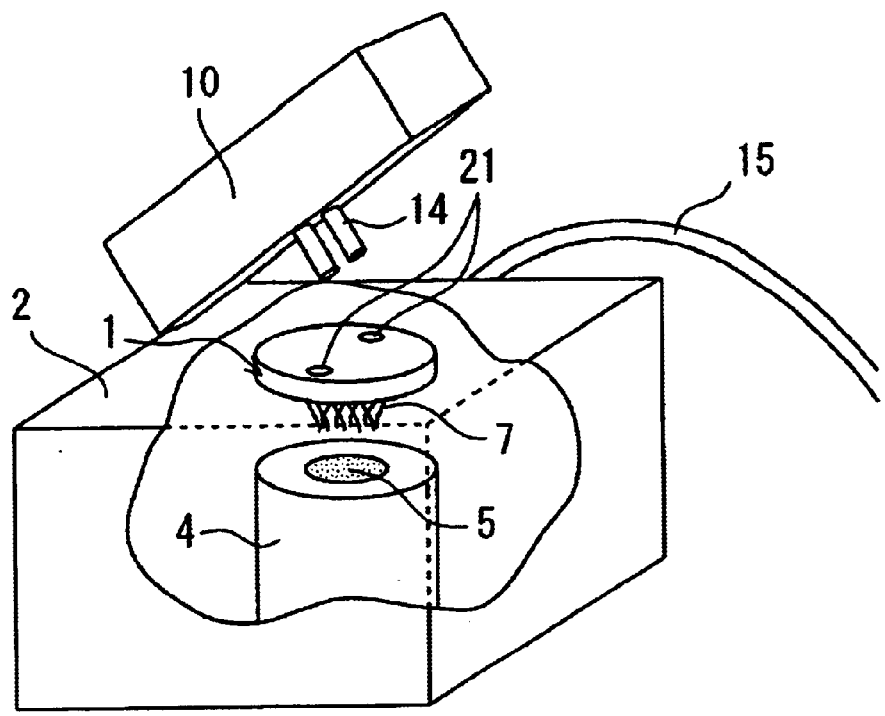
FIG. 16 is a perspective view showing a part of the constitution of the prober.
Figure 17:
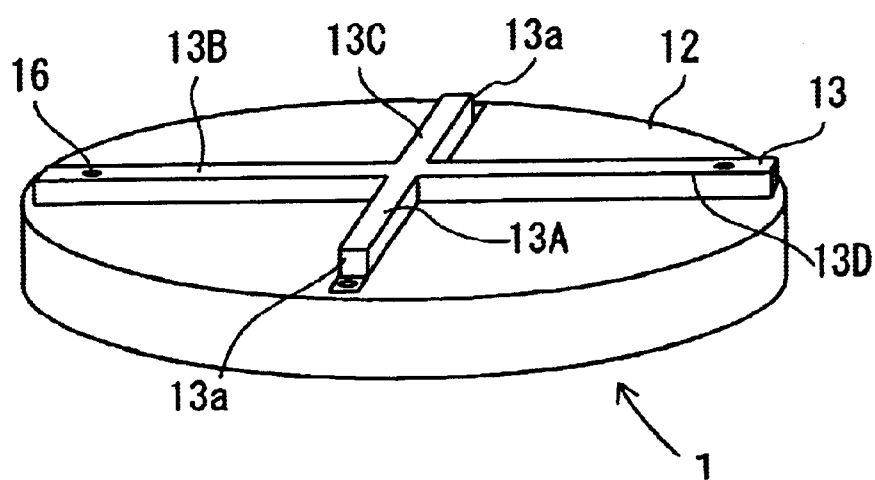
FIG. 17 is a perspective view showing a probe card.
Figure 18:
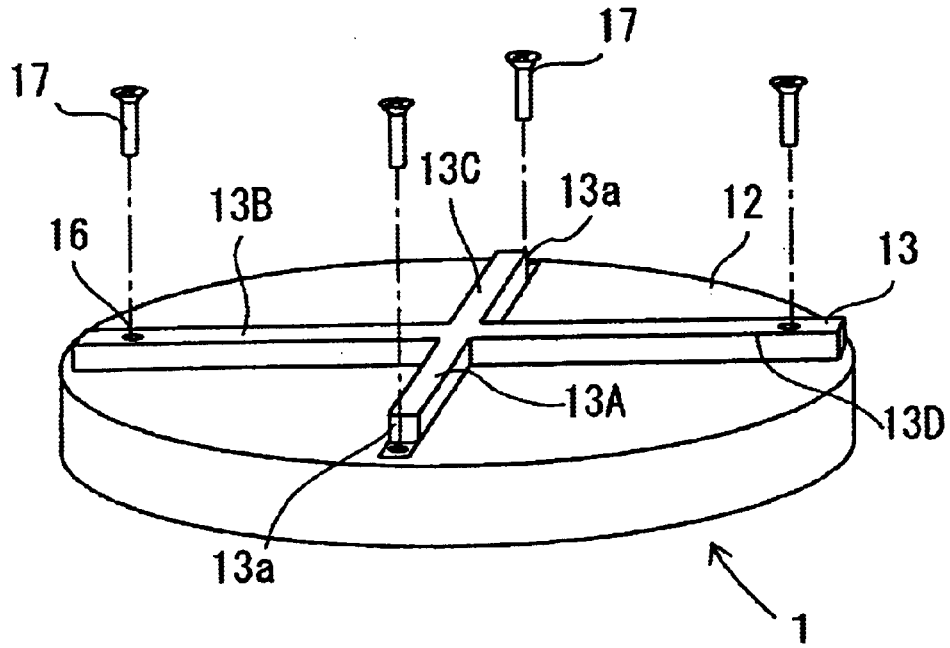
FIG. 18 is a perspective view showing the probe card at the state to be attached by screws.

A first embodiment of the semiconductor element test apparatus according to the present invention adopts, in their present forms, the overall construction of the apparatus shown in FIG. 8, a connection between the semiconductor elements and the probe needles shown in FIG. 9, a state of contact between the electrode pads and the probe needles shown in FIG. 10, the construction of the wafer prober shown in FIG. 11, and the construction of the probe card hold member shown in FIG. 15.

Figure 1:
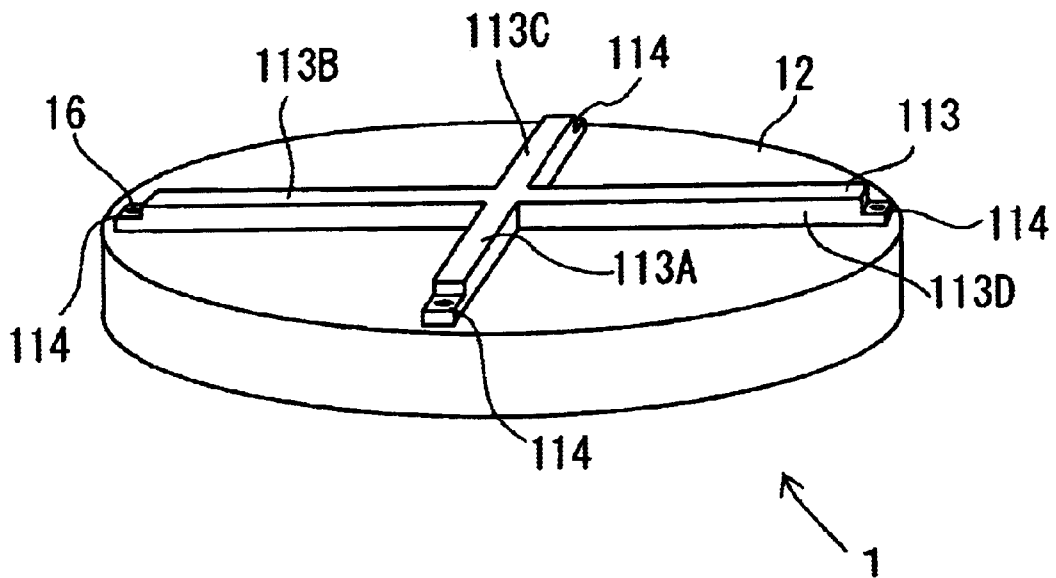
FIG. 1 is a perspective view showing the constitution of a probe card according to the first embodiment of the present invention.

The first embodiment employs an improved probe card 1 such as that shown in FIG. 1. The probe card 1 has the probe card substrate 12 having an improved reinforcement member 113. The reinforcement member 113 is formed by means of punching a flat plate of uniform thickness and has the shape of a cross. The reinforcement member 113 has four reinforcement arms 113A, 113B, 113C, and 113D, which intersect at right angles.

Counterbores 114 having the same depth and shape are formed at the respective tip ends of the reinforcement arms 113A, 113B, 113C, and 113D.

Accordingly, the reinforcement member 113 has a structure in which the reinforcement arms are uniform. Through use of the uniform reinforcement arms 113A, 113B, 113C, and 113D, uniform reinforcement strength can be imparted to the probe card substrate 12 by way of the respective reinforcement arms 113A, 113B, 113C, and 113D. The stress imposed on the probe card substrate 12 by the probe needles 7 and the ZIF connectors 11 is uniformly dispersed. As a result, the strength and durability of the probe card substrate 12 can be increased, and there can be mitigated occurrence of warpage, which would otherwise arise as a result of long-term use of the probe card substrate 12.

The positioning pins 14 of the test head 10 are prevented from coming into contact with the reinforcement arms 113A and 113C by means of the counterbores 114 formed at the tip ends thereof, thus enabling the positioning pins 14 to position the probe card substrate 12 without involvement of any problems.

Figure 2A:
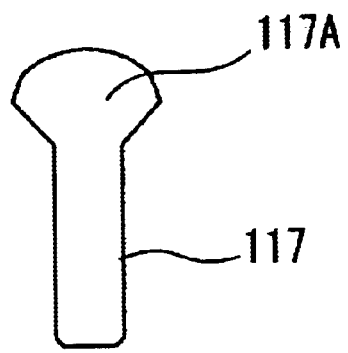
FIGS. 2A and 2B are typical views showing a round-head screw according to the first embodiment of the present invention.

In the first embodiment, the reinforcement member 113 is attached to the probe card hold member 26 shown in FIG. 15 along with the probe card substrate 12 through use of one type of screw. A round-head screw 117 shown in FIG. 2 is used as one type of screw. As shown in FIG. 3, the screws 117 are inserted into the counterbores 114 formed in the respective reinforcement arms 113A, 113B, 113C, and 113D. In respective mount positions, the screws 117 penetrate through the counterbores 114 and the probe card substrate 12 positioned below the counterbores 114. Thus, the screws 117 are fastened to the ring-shaped probe card hold member 26. In respective mount positions, the round-head screws 117 which are shown in FIG. 2 and are of the same type and length are used. Thus, uniform strength is imparted to the respective mount positions. The uniform fastening strength is effective for reducing occurrence of warpage in the probe card substrate 12. Reference numeral 16 designates fastening holes for the screws 117 formed in the respective counterbores 114. Use of screws of the same type facilitates fastening and removal of screws and is effective for shortening work time.

Each of he screws 117 has a bulging screw head 117A. The bulging screw head 117A is effective for increasing the depth of a socket 117a. The bulging head 117A is effective for preventing collapse of the socket 117a, which would otherwise be caused by fastening and removal of the screw 117. As a result, the life of the screws 117 is increased, thus diminishing frequency of replacement of the screws 117 during a given period of time.

Figure 2B:
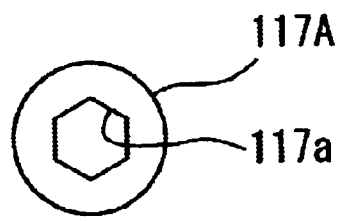
Figure 3:
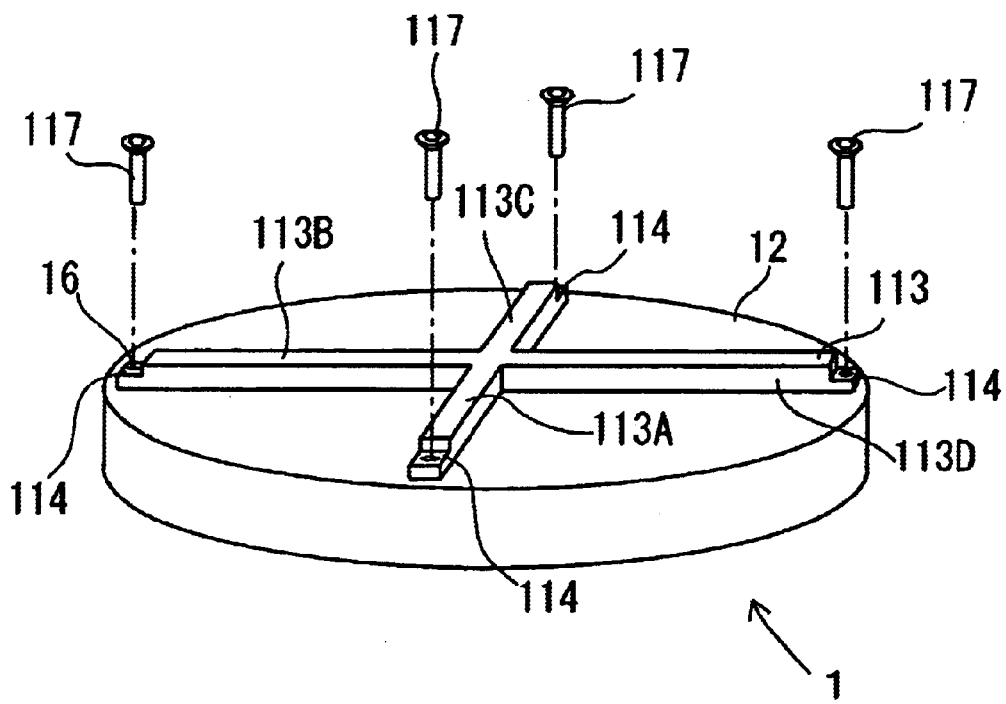
FIG. 3 is a perspective view showing the probe card at a state to be attached by screws at each mount positions.
Figure 19A:
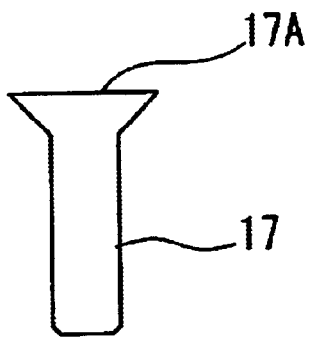
FIGS. 19A and 19B are typical views showing a round-head screw.
Figure 19B:
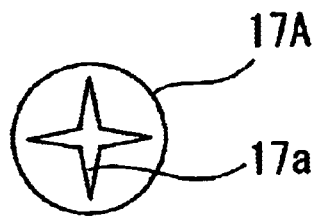

As shown in FIG. 2B, each of the round-head screws 117 has a hexagonal socket 117a. In contrast with the related-art cross-head slot 17a shown in FIG. 19B, the socket 117a is effective for improving durability. As compared with the cross-head slot 17a, the socket 117a receives torque imposed thereon at a greater number of points. As a result, the durability of the round-head screws 117 is increased.

Screws formed from magnetic substance; for example, ferrous material, are used for the round-head screws 117. Use of the magnetic screws 117 enables transport while being magnetically attracted to a driver. Even when the space of each of the counterbores 114 is small, fastening and removal of the screws 117 is facilitated. In this case, a driver having a magnetized bit is used.

The round-head screws 117 may be used limitedly for some screws, and magnetic screws may be used limitedly for some screws. In either case, the advantage set forth is yielded.

Second Embodiment

Figure 4:
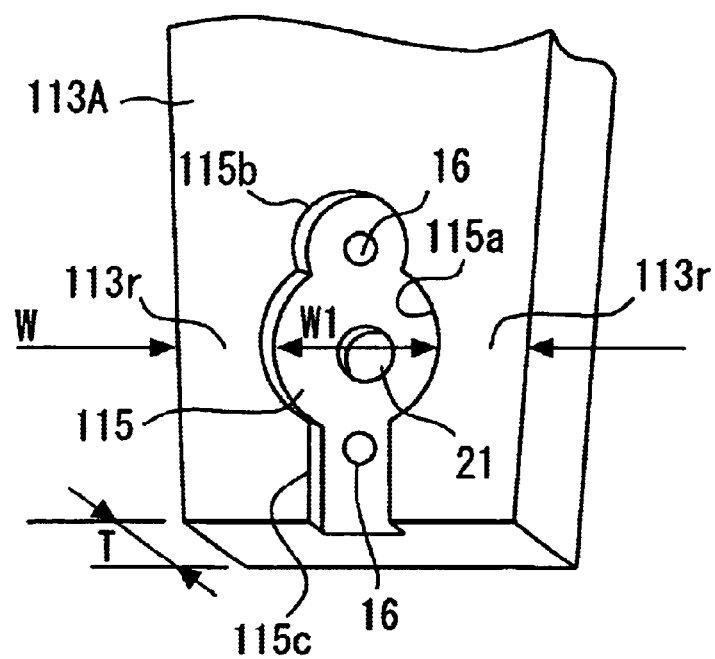
FIG. 4 is a perspective view showing the tip end of a reinforcement member according to the second embodiment of the present invention.

A second embodiment corresponds to the semiconductor element test apparatus according to the first embodiment to which additional improvements have been made. In the second embodiment, improved counterbores 115 are formed at the respective tip ends of the four reinforcement arms 113A, 113B, 113C, and 113D of the reinforcement member 113. FIG. 4 shows the counterbore 115 formed at the tip end of the reinforcement arm 113A. Another counterbore 115 identical in depth and shape with the counterbore 115 is formed at the tip end of each of the remaining reinforcement arms 113B, 113C, and 113D.

The reinforcement arms are formed such that the tip ends of the respective arms assume the same thickness and width. FIG. 4 shows the thickness T and width W of the reinforcement arm 113A. The counterbore 115 has the shape of a gourd and is formed at the tip end of each of the reinforcement arms 113A through 113D. The counterbore 115 includes a larger center circular hole 115a, a smaller circular hole 115b communicating with the inside of the circular hole 115a, and a linear hole 115c extending from the tip end face of the reinforcement arm from the circular hole 115a. The holes 115a, 115b, and 115c are formed so as to assume identical depths. A hole 21 through which the positioning pin 14 of the test head 10 is to pass is formed in the center of the circular hole 115a. A mount hole 16 into which the mount screw 117 is to be inserted is formed in the center of the circular hole 115b and at the inner end of the linear hole 115c. In the second embodiment, two mount screws 117 are used for fastening each of the reinforcement arms 113A through 113D, and the reinforcement arm 113 is fastened more firmly by use of a total of eight mount screws 117. In the second embodiment, a total of eight holes or four hole pairs, each pair consisting of two screw holes corresponding to the two mount holes 16, are formed in the probe card hold member 26.

The diameter W1 of the circular hole 115a is smaller than the width W of the reinforcement arm in which the circular arms 115a is formed; namely, about half the width W of the reinforcement arm. The circular hole 115a is formed in the center of the width w of the reinforcement arm. Hence, a remaining portion 113r having a thickness T still remains on either side of the counterbore 115. The remaining portions 113r are effective for sufficiently increasing the strength of a reinforcement arm, by means of imparting high strength to either side of the counterbore 115. The remaining portions 113r are effective for sufficiently increasing the strength of the reinforcement arm, as well as for reducing warpage of the probe card 12 to a much greater extent.

Third Embodiment

Figure 5:
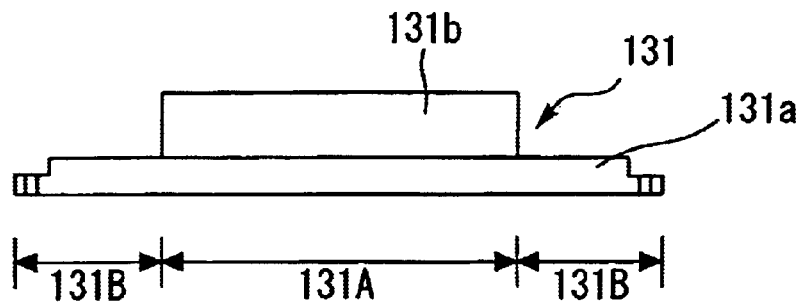
FIG. 5 is a side view of a reinforcement member according to the third embodiment of the present invention.

A third embodiment corresponds to the semiconductor element test apparatus according to the first embodiment to which additional improvements have been made. In the third embodiment, an improved reinforcement member 131 shown in FIG. 5 is used. The reinforcement member 131 has a center portion 131A and a peripheral portion 131B. The reinforcement member 131 is constituted of a reinforcement member 131a and a center reinforcement member 131b connected to the center thereof. The reinforcement member 131a is formed by means of punching a flat plate, in the same manner as in the case of the reinforcement member 113 shown in FIG. 1. The reinforcement member 131a has four reinforcement arms 113A, 113B, 113C, and 113D. The reinforcement arms 113A, 113B, 113C, and 113D extend to the peripheral portion 131B. In the center portion 131A, a center reinforcement member 131b formed by punching in the same manner is connected to the center portion of the reinforcement member 131a.

The third embodiment yields the same advantage as that yielded in the first embodiment. Further, the strength of the reinforcement member 131 is increased further, thus further enhancing the reinforcing effect.

Figure 6:
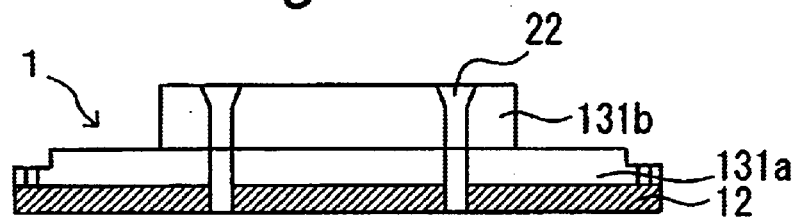
FIG. 6 is a side sectional view of another example of reinforcement members according to the third embodiment of the present invention.

The center reinforcement member 131b and the reinforcement member 131a are bonded through use of welding or screwing, as well as an adhesive. FIG. 6 shows an example of screwing. The center reinforcement member 131b is bonded to the reinforcement member 131a by means of screws 22 as well as to the probe card board 12 by means of the screws 22.

Fourth Embodiment

A fourth embodiment corresponds to the semiconductor element test apparatus according to the first embodiment to which additional improvements have been made. In the fourth embodiment, a reinforcement member 132 shown in FIG. 7A or a reinforcement member 132A shown in FIG. 7B is employed. Each of the reinforcement members 132 and 132A has a center frame section 133 and a peripheral section 134. The center frame section 133 has a rectangular frame section and has four sides 133a, 133b, 133c, and 133d, which form right angles. Four reinforcement arms 134A, 134B, 134C, and 134D extend to the outside at right angles from the centers of the respective four sides 133a through 133d. The four reinforcement arms 134A through 134D constitute the peripheral section 134. Counterbores 114 identical with those shown in FIG. 1 are formed, to the same depth and in the same shape, in the tip ends of the respective reinforcement arms 134A through 134D.

Figure 7A:
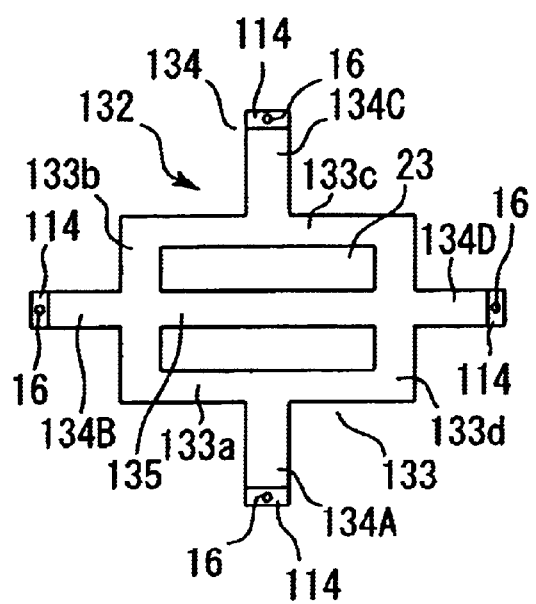
FIGS. 7A and 7B are top views showing reinforcement members according to the third embodiment of the present invention.
Figure 7B:
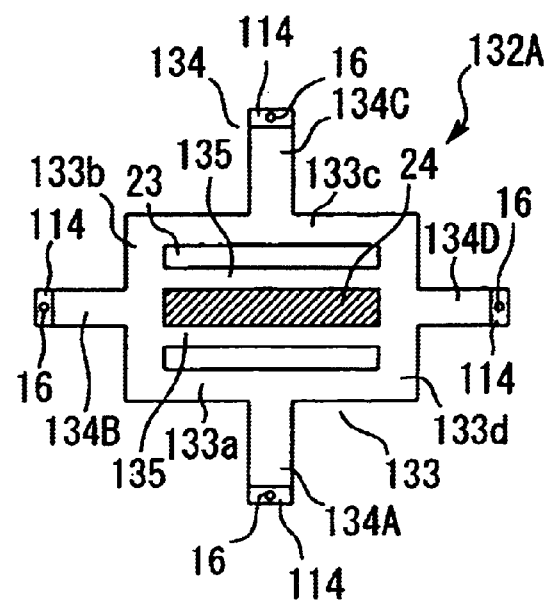

Each of the reinforcement member 132 shown in FIG. 7A and the reinforcement member 132A shown in FIG. 7B has at least one reinforcement piece 135 provided in the center frame section 133. The reinforcement member 132 shown in FIG. 7A has one reinforcement piece 135 provided between mutually-opposing sides 133b and 133d. Meanwhile, the reinforcement member 132A shown in FIG. 7B has two mutually-parallel reinforcement pieces 135. In conjunction with the center frame section 133, the reinforcement pieces 135 increase the strength of the reinforcement members 132 and 132A to a much greater extent, thereby reducing warpage in the probe card substrate 12. The reinforcement members 132 and 132A are wholly formed to the same thickness by means of punching a single flat plate.

Reference numeral 23 shown in FIGS. 7A and 7B designates an area enclosed by the center frame section 133 and the reinforcement piece 135. The probe needles 7 are provided upright on the probe card substrate 12 in an area below the area 23. The area 24 shown in FIG. 7B represents the position of an opening in the probe card substrate 12. FIG. 7A corresponds to the probe card substrate 12 having no opening. FIG. 7B corresponds to the probe card substrate 12 having an opening. When required, the area 23 is formed in the reinforcement member 132. In the same manner, when required, the area 24 is formed in the reinforcement member 132A. The reinforcing effect of the reinforcement pieces 135 is as has been mentioned previously.

Fifth Embodiment

A fifth embodiment relates to a method of testing the semiconductor elements 6 through use of any one of the pieces of semiconductor element test apparatus described in connection with the first through fourth embodiments. According to the method, the test apparatus reduces warpage of the probe card substrate 12. Hence, there is yielded an effect of enabling testing of a semiconductor element while preventing undesired deterioration of manufacturing yield stemming from warpage.

The features and the advantages of the present invention as described above may be summarized as follows.

According to one aspect of the present invention, by means of the semiconductor element test apparatus <<according to the present invention>>, various mount structures which are substantially analogous to each other can be realized at a plurality of mount positions in which a probe card substrate and a reinforcement member are fastened to a probe card hold member. Accordingly, warpage in the probe card substrate can be reduced.

In another aspect, screws having the same length or screws of the same type are used for mounting. Accordingly, commonality of screws can be realized and thereby warpage of a probe card substrate further can be reduced.

In another aspect, round-head screws having bulging screw heads are used. Accordingly, durability of a screw further can be increased in and the frequency of replacement of screws can be reduced.

In another aspect, screws formed from a magnetic substance are used. Accordingly, fastening and removal of screws further can be facilitated.

In another aspect, a counterbore narrower than the width of an end portion of the reinforcement arm is formed in substantially the center of the end portion of each reinforcement arm. Further, the center portion of the reinforcement member is formed so as to have a grater thickness than that of surrounding areas, and reinforcement pieces are added to a frame-shaped center section. Accordingly, the strength of the reinforcement member is increased, thereby further reducing warpage of the probe card substrate.

In another aspect, the center portion of the reinforcement member is bonded to the probe card substrate. Accordingly, the bonding strength acting between the reinforcement member and the probe card substrate is increased, and warpage of the probe card substrate can be reduced further.

According to one aspect of the present invention, by means of the semiconductor element test method, there is used the semiconductor element test apparatus according to the present invention which enables realization of various mount structures substantially analogous to each other at a plurality of mount positions at which a probe card substrate and a reinforcement member are fastened to a probe card hold member. Accordingly, warpage in the probe card substrate can be reduced.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-113903, filed on Apr. 12, 2001 including specification, claims, drawings and summary, on which the Convention priority of the present application is based, are incorporated herein by reference in its entirety.

What is claimed is:

1. A semiconductor element test apparatus comprising:
 a stage on which a semiconductor wafer having semiconductor elements is to be mounted;
 a probe card having a plurality of probe needles opposing the semiconductor wafer; and
 a probe card hold member for holding test probe card; and
 the semiconductor elements are tested by bring the plurality of probe needles into contact with the semiconductor elements of the semiconductor wafer, wherein
 the probe card has a probe card substrate for supporting the plurality of probe needles and a reinforcement member for reinforcing the probe card substrate, and the reinforcement member has a plurality of mount positions and counterbores of substantially the same depth and shape in each of the plurality of mount positions; and
 the probe card substrate is attached to the probe card hold member through the reinforcement member at the counterbores by screws, wherein the reinforcement member has
 a peripheral section having the plurality of mount positions, and
 a center section having a thickness greater than a thickness of the peripheral portion.

2. The semiconductor element test apparatus according to claim 1, wherein screws having the same length are used in the respective mount positions.

3. The semiconductor element test apparatus according to claim 1, wherein the reinforcement member is attached to the probe card hold member by means of a screw at each of mount positions at respective end sections of a plurality of reinforcement arms, and, in each of the reinforcement arms, a counterbore narrower than the width of the end section of the reinforcement arm is formed in substantially the center of the reinforcement arm with respect to a widthwise direction thereof, as well as in the end section of the reinforcement arm.

4. The semiconductor element test apparatus according to claim 1, wherein the reinforcement member has a peripheral section having the plurality of mount positions and a center section located at the center of the peripheral section, and the reinforcement member and the probe card substrate are fastened to each other in the center section.

5. The semiconductor element test apparatus according to claim 1, wherein screws of the same type are used in the respective mount positions.

6. The semiconductor element test apparatus according to claim 5, wherein round-head screws having bulging screw heads are used as the screws.

7. The semiconductor element test apparatus according to claim 5, wherein screws formed from a magnetic substance are used as the screws.

8. A semiconductor element test apparatus comprising:
 a stage on which a semiconductor wafer having semiconductor elements is to be mounted;
 a probe card having a plurality of probe needles opposing the semiconductor wafer; and
 a probe card hold member for holding test probe card; and
 the semiconductor elements are tested by bring the plurality of probe needles into contact with the semiconductor elements of the semiconductor wafer, wherein
 the probe card has a probe card substrate for supporting the plurality of probe needles and a reinforcement member for reinforcing the probe card substrate, and the reinforcement member has counterbores of substantially the same depth and shape in a plurality of mount positions;
 the reinforcement member comprises a peripheral section having a plurality of reinforcement arms, each reinforcement arm having the mount position, and a frame-shaped center section, and a reinforcement piece for two interconnecting mutually-opposing sides of the frame-shaped center section is provided in the center section; and
 the probe card substrate is attached to the probe card hold member through the reinforcement member at the counterbores by screws.

9. A method of testing a semiconductor element through use of a semiconductor test apparatus which brings a plurality of probe needles provided on a probe card into contact with semiconductor elements of a semiconductor wafer, wherein the probe card has a probe card substrate for supporting the plurality of probe needles, and a reinforcement member to be used with the probe card substrate;

the semiconductor element test apparatus has a probe card hold member having the probe card attached thereto;

the reinforcement member is attached to the probe card substrate and to the probe card hold member at a plurality of mount positions by means of screws; counterbores of substantially the same depth and shape are formed in each of the respective mount positions on the reinforcement member; and the probe card substrate is attached to the probe card hold member by means of the screws and by way of the counterbores, wherein the reinforcement member has a peripheral section having the plurality of mount positions, and a center section having a thickness greater than a thickness of the peripheral portion.

* * * * *